United States Patent [19]

Madoux et al.

[11] Patent Number: 5,786,127
[45] Date of Patent: Jul. 28, 1998

[54] PHOTOSENSITIVE ELEMENT HAVING AN OVERCOAT WHICH INCREASES PHOTO-SPEED AND IS SUBSTANTIALLY IMPERMEABLE TO OXYGEN

[75] Inventors: David C. Madoux, Maryland Heights; Edward H. Parker, Ballwin, both of Mo.

[73] Assignee: Western Litho Plate & Supply Co., St. Louis, Mo.

[21] Appl. No.: 698,549

[22] Filed: Aug. 15, 1996

[51] Int. Cl.$^6$ ............................................................ G03F 7/11
[52] U.S. Cl. ................................................................ 430/273.1
[58] Field of Search ................................................. 430/273.1

[56] References Cited

U.S. PATENT DOCUMENTS

| | | | |
|---|---|---|---|
| 3,433,638 | 3/1969 | Ohi et al. | 96/84 |
| 3,458,311 | 7/1969 | Alles | 96/35.1 |
| 3,753,715 | 8/1973 | Klupfel et al. | 430/273.1 X |
| 3,808,002 | 4/1974 | Eckert et al. | 96/48 |
| 3,961,955 | 6/1976 | Gracia et al. | 96/33 |
| 4,072,527 | 2/1978 | Fan | 430/273.1 |
| 4,072,528 | 2/1978 | Bratt | 96/87 |
| 4,258,122 | 3/1981 | Uchida et al. | 430/253 |
| 4,528,262 | 7/1985 | Nakano et al. | 430/273.1 X |
| 4,537,855 | 8/1985 | Ide | 430/285 |
| 4,565,759 | 1/1986 | Tsutsui | 430/66 |
| 4,594,310 | 6/1986 | Nagasaka | 430/281 |
| 4,614,681 | 9/1986 | Hayashi et al. | 428/201 |
| 4,621,044 | 11/1986 | Fujikawa | 430/281 |
| 4,740,450 | 4/1988 | Tamaoki et al. | 430/273.1 |
| 4,927,737 | 5/1990 | Walls et al. | 430/278 |
| 4,942,111 | 7/1990 | Wade et al. | 430/273 |
| 4,966,830 | 10/1990 | Nagasaka et al. | 430/281 |
| 4,985,470 | 1/1991 | Nagasaka et al. | 522/26 |
| 4,990,428 | 2/1991 | Shimizu et al. | 430/276 |
| 5,013,632 | 5/1991 | Weber | 430/281 |
| 5,061,607 | 10/1991 | Walls | 430/309 |
| 5,069,999 | 12/1991 | Higashi et al. | 430/272 |
| 5,077,175 | 12/1991 | Fryd et al. | 430/273.1 |
| 5,120,772 | 6/1992 | Walls et al. | 522/63 |
| 5,143,813 | 9/1992 | Joerg | 430/162 |
| 5,206,113 | 4/1993 | Mueller-Hess et al. | 430/270 |
| 5,206,278 | 4/1993 | Famili et al. | 524/377 |
| 5,206,349 | 4/1993 | Iida et al. | 534/561 |
| 5,213,945 | 5/1993 | Roos et al. | 430/273.1 X |
| 5,219,709 | 6/1993 | Nagasaka et al. | 430/281 |
| 5,235,015 | 8/1993 | Ali et al. | 528/304 |
| 5,264,317 | 11/1993 | Bagchi et al. | 430/138 |
| 5,273,862 | 12/1993 | Zertani et al. | 430/273 |
| 5,340,681 | 8/1994 | Sypek et al. | 430/138 |
| 5,345,870 | 9/1994 | Bailey et al. | 101/463.1 |
| 5,353,705 | 10/1994 | Lewis et al. | 101/453 |
| 5,397,678 | 3/1995 | Sato et al. | 430/258 |
| 5,409,800 | 4/1995 | Sato et al. | 430/263 |
| 5,459,010 | 10/1995 | Shimizu et al. | 430/175 |
| 5,482,810 | 1/1996 | Nakayama et al. | 430/130 |
| 5,506,090 | 4/1996 | Gardner, Jr. et al. | 430/302 |
| 5,514,522 | 5/1996 | Fitzgerald et al. | 430/284.1 |
| 5,563,023 | 10/1996 | Kangas et al. | 430/273.1 |

FOREIGN PATENT DOCUMENTS

| | | | |
|---|---|---|---|
| 1082026 | 7/1980 | Canada | G03C 1/68 |
| 2051971 | 9/1991 | Canada | G03F 7/21 |
| 90/09622 | 8/1990 | European Pat. Off. | G03F 7/11 |
| 50-150501 | 12/1975 | Japan | G03F 7/02 |
| 53024839 | 3/1978 | Japan | G03G 5/14 |
| 57124730 | 8/1982 | Japan | C08F 120/40 |
| 60-200249 | 10/1985 | Japan | 430/273 |
| 60-263141 | 12/1985 | Japan | 430/273.1 |
| 61-117549 | 6/1986 | Japan | 430/273.1 |
| 61-285444 | 12/1986 | Japan | G03C 1/00 |
| 62079440 | 4/1987 | Japan | G03C 1/00 |
| 88064769 | 12/1988 | Japan | C08F 120/40 |
| 1159653 | 6/1989 | Japan | G03C 1/68 |
| 5-27419 | 2/1993 | Japan | 430/273.1 |
| 5-142766 | 6/1993 | Japan | G03F 7/021 |
| 5323588 | 12/1993 | Japan | G03F 7/11 |
| 7043905 | 2/1995 | Japan | G03F 7/11 |
| 7319160 | 12/1995 | Japan | C08F 2/48 |
| 1051488 | 10/1983 | U.S.S.R. | G03C 5/00 |
| 1553823 | 10/1979 | United Kingdom | G03C 1/00 |

OTHER PUBLICATIONS

English translation of Japanese Patent Application Disclosure No. 60-263141.

Koike et al, Abs. Grp. No. P459, vol. 10, No. 143, Patent Abstracts of Japan, English Abstract of Japanese Patent Publication 60-263141, May 27, 1986.

Koike et al, Derwent Information LTD, AN 86-045174, English Abstract of JP 60-263141.

Schildknecht, *Vinyl abd Related Polymers: Their Preparations, Properties and Applications in Rubbers, Plastics, Fibers, and in Medical and Industrial Arts*, (John Wiley & Sons, Inc., New York, NY, 1952, pp. 628–630.

Kaufman et al, eds, *Introduction to Polymer Science and Technology: An SPE Textbook*, John Wiley & Sons, New York, NY, 1977, pp. 128–130.

Grant et al, *Grant & Hackh's Chemical Dictionary*, Fifth edition, McGraw–Hill Book Company, New York, NY, 1987, p. 455.

*Primary Examiner*—Cynthia Hamilton
*Attorney, Agent, or Firm*—Senniger, Powers, Leavitt & Roedel

[57] ABSTRACT

This invention relates to a novel photosensitive element comprising: a support having a surface; a photosensitive layer on the surface; and a transparent, protective coating on the photosensitive layer. The photosensitive layer comprises a composition of an ethylenically unsaturated compound and a photo-initiator, and is capable of photo-initiated addition polymerization. The PVA-based protective coating is substantially impermeable to atmospheric oxygen. In accordance with this invention, it has been discovered that photospeed in a photosensitive element is substantially enhanced if this coating contains a acid, and especially if the coating exhibits an acidic pH, preferably less than about 5.5. The protective coating preferably also contains a second polymer which imparts surface hardness and scratch resistance to the protective coating. The coating may further contain a plasticizer to impart flexibility and inhibit cracking and snowflaking.

34 Claims, No Drawings

PHOTOSENSITIVE ELEMENT HAVING AN OVERCOAT WHICH INCREASES PHOTO-SPEED AND IS SUBSTANTIALLY IMPERMEABLE TO OXYGEN

BACKGROUND OF THE INVENTION

This invention relates to the field of photo-imaging and printing, and is directed to a photosensitive element comprising a support, a photosensitive layer, and a protective coating.

This photosensitive element is especially useful as a pre-sensitized plate for use in making a lithographic printing plate. Such a pre-sensitized plate is made by pre-treating a surface of an aluminum or other support to render it highly hydrophilic, and then coating it with a photosensitive layer. If the plate is a negative-working plate, the photosensitive layer is polymerized, cross-linked, or otherwise converted into an insoluble, oleophilic material when the plate is exposed to light. Thus, upon image-wise exposure of light to the plate, the photopolymerizable, photosensitive layer is polymerized in the areas of the plate which are exposed to the light. When a developer (which is typically aqueous) is subsequently applied to the plate, this polymerized portion of the layer—which is insoluble in the developer—remains on the plate, while the unexposed, unpolymerized portion of the layer—which is soluble in the developer—is removed from the plate. This creates oleophilic areas where the plate is exposed to light (i.e., where the polymer remains after development) and hydrophilic areas where the plate is not exposed to light (i.e., where the unpolymerized, photosensitive layer is removed by the developer). These contrasting oleophilic and hydrophilic areas allow for preferential retention of a greasy, image-forming substance on an image area.

The photosensitive layer commonly comprises a polymerizable, ethylenically unsaturated compound and a photopolymerization initiator. The ethylenically unsaturated compound polymerizes when the photopolymerization initiator is activated by light or ultraviolet radiation. This occurs through a free-radical mechanism. Under this mechanism, the energy source—the light or ultraviolet radiation—generates free radicals through the photolysis of the initiator. These free radicals, in turn, initiate addition polymerization of the ethylenically unsaturated compound.

The photopolymerization reaction is severely inhibited by oxygen. If oxygen is absorbed by the photosensitive layer while the plate is being exposed to light or ultraviolet radiation, it is believed that the free radical process is quenched by a chain stopping reaction between the oxygen molecules and the free radicals. For this reason, various attempts have been made to exclude oxygen from the photosensitive layer. Some have suggested exposing the plate to the image in the presence of an inert atmosphere (e.g., nitrogen or argon) or a vacuum. But this requires expensive equipment and is therefore impractical. Others have suggested placing a removable Mylar film which must be manually pulled off of the plate following exposure. But this technique does not lend itself well to automation.

A more effective method is to coat a soluble, transparent, oxygen-excluding barrier onto the photosensitive layer. Traditionally, materials used for this purpose have included polyvinyl alcohol (PVA). But use of PVA alone is disadvantageous. For example, PVA alone tends to scratch easily. It also does not exhibit optimal adhesion to many types of photosensitive layers. Thus, there have been numerous attempts to enhance protective coatings for photosensitive layers.

Canadian Patent Application No. 2,051,971 (Konrad et al.) discloses a topcoat for a photosensitive layer containing a combination of a photopolymerizable mixture with a light-curable diazonium salt polycondensation product. Konrad et al. disclose that this topcoat has a pH of from about 3 to about 7 and comprises: (i) a water-soluble polymer (e.g., PVA) having low permeability for atmospheric oxygen; and (ii) a water-soluble hydrogen phosphate. Konrad et al. state that a photosensitive recording material having this topcoat exhibits long shelf life with a low tendency to stick and, at the same time, has good photosensitivity. They also state that up to 10% by weight of a surface active agent may be added to the topcoat to improve wetting.

Canadian Patent No. 1,082,026 (Wagner et al.) discloses an oxygen barrier comprising an alkali-soluble partial ester of polyvinyl alcohol having at least two percent of its hydroxyl groups esterified with succinic acid, glutaric acid, or phthalic acid. Wagner et al. also discloses having a small amount of a surface-active agent (e.g., octyl phenoxy polyethoxy ethanol) in the coating solution. In its examples, Wagner et al. states that this coating does not become insoluble in an alkaline, ethanolic solution over periods of storage.

U.S. Pat. No. 4,072,527 (Fan) and U.S. Pat. No. 4,072,528 (Bratt) disclose oxygen-barrier, protective layers for photopolymerizable elements. In particular, both references disclose a protective layer that contains a water-soluble macromolecular organic polymer or copolymer (e.g., PVA) having dispersed therein finely-divided, solid particles of a water-insoluble polymer or copolymer. Fan and Bratt indicate that these particles improve adhesion between the protective coating and the photosensitive layer. These references also disclose adding a surfactant to the oxygen barrier. Fan and Bratt suggest that a more uniform layer results from adding the surfactant.

U.S. Pat. No. 5,143,813 (Joerg) discloses a cover layer for a light-sensitive layer. Joerg indicates that the purpose of this layer is to serve as an oxygen barrier. The light-sensitive layer contains a combination of a photopolymerizable mixture with a light-curable diazonium salt polycondensation product. Joerg discloses that the cover layer contains a water-soluble polymer and an acid. Joerg suggests that PVA and polyvinyl pyrrolidone (PVP) are suitable water-soluble polymers, and that mineral acids (e.g., sulfuric acid and phosphoric acid) are suitable acids. Joerg states that the addition of the acid increases the stability of the light-sensitive layer.

U.S. Pat. No. 5,340,681 (Sypek) discloses a non-photosensitive overcoat acting as a barrier to oxygen for a light-sensitive layer containing a photopolymerizable composition which includes at least one photopolymerizable compound; at least one photo-initiator; at least one light-sensitive diazonium compound; and a photopolymerizable pigment composition. Sypek generally discloses that this overcoat may contain water-soluble polymers and/or water dispersions of non-water-soluble polymers which form an effective barrier to atmospheric oxygen. Sypek lists several polymers (including PVA) which Sypek states are suitable. Sypek also discloses generally that additional materials such as surfactants, plasticizers, and fillers may be added to the coating. Sypek states that these additives may improve coat-ability and stability of the coating. In the working examples, Sypek discloses an overcoat containing PVA, a surfactant, a carboxylated styrene butadiene copolymer emulsion, and citric acid (to adjust the pH). Sypek indicates that adding an oxygen-excluding overcoat retards the inhibition of photopolymerization by atmospheric oxygen and leads to solvent resistance of the plate's image. But Sypek does not teach or suggest adding acid to the overcoat to enhance photo-speed.

U.S. Pat. No. 5,273,862 (Zertani et al.) discloses a cover layer for a photopolymerization material. Zertani et al. discloses that this cover layer contains: (i) a water-soluble polymer which is substantially impermeable to atmospheric oxygen; and (ii) a water-soluble polymer which binds to oxygen. Zertani et al. lists several water-soluble polymers which Zertani et al. suggest may be used. These include PVA, gelatin, gum arabic, copolymers of alkyl vinyl ethers and maleic anhydride, PVP, and ethylene oxide. Zertani et al. discloses that the oxygen-binding polymers are compounds having aliphatic amino groups and, in particular, are polyalkyleneimines. Zertani et al. additionally discloses adding up to about 10% of a surface-active agent to the coating. Zertani et al. suggests that this coating composition leads to a reduced sensitivity to atmospheric oxygen, even during prolonged storage, elevated ambient temperatures, and elevated atmospheric humidity.

U.S. Pat. No. 4,942,111 (Wade et al.) discloses a barrier layer to prevent oxygen inhibition of a radiation sensitive composition comprising an ethylenically unsaturated compound and a photo-initiator. Wade et al. discloses that this barrier comprises a polymer (e.g., PVA) and an amphoteric compound. Wade et al. suggest that this coating enhances the shelf life and handling properties of the plate.

U.S. Pat. No. 5,409,800 (Sato et al.) discloses a photosensitive transfer material having an intermediate layer which is dispersible or soluble in water or an aqueous alkaline solution and exhibits low oxygen permeability. Sato et al. generally discloses that suitable materials for the intermediate layer include polyvinyl ether/maleic anhydride polymers, water-soluble salts of a carboxyalkyl cellulose, water-soluble cellulose ethers, water-soluble salts of carboxylated starch, PVA, PVP, water-soluble salts of polyacrylic acid, gelatin, ethylene oxide polymers, water soluble salts of various types of starch and analogues thereof, styrene-maleic acid copolymers, maleate resins, and combinations of two or more thereof. In particular, Sato et al. discloses an intermediate layer having a combination of PVA and PVP. Sato et al. also disclose including a fluorine containing surfactant in the intermediate layer. Sato et al. state that if the concentration of PVP in the intermediate layer is less than 1% by weight, sufficient adhesion to the adjacent photosensitive layer may not be obtained. Sato et al. also state that if the PVP concentration exceeds 75% by weight, the oxygen barrier properties of the intermediate layer would be reduced.

Although PVA is known to be a highly effective oxygen barrier, particular coatings based on PVA alone are vulnerable to scratching. While the hardness of a PVA coating may be enhanced by addition of a second polymer, inclusion of a proportion of the second polymer sufficient to significantly improve scratch-resistance may lead to cracking or "snow-flaking" (i.e., pinholes that resemble snow flakes on developed plates where the oxygen-barrier coat shrank and pulled the photosensitive layer off of the support before exposure and development) during storage and handling, especially in low-humidity conditions. This, in turn, leads to a loss of oxygen-barrier properties. Thus, there is still a need for an oxygen-barrier, protective coating which exhibits increased scratch resistance and adhesion, without having an increased tendency to crack or snow-flake over time.

Moreover, since processing time and costs are dependent on photo-speed, there is an ever-present need for a protective coating which will increase the photo-speed of the plate beyond that of a plate which has a protective coating comprising PVA alone. In addition, there is always a need for a protective coating which lengthens the shelf-life of the pre-sensitized plate; and enhances release of unpolymerized portions of the photosensitive layer during development and reduces background color.

SUMMARY OF THE INVENTION

Among the several objects of the present invention, therefore, is to provide a photosensitive element, and more particularly, a pre-sensitized plate for use in making a lithographic printing plate. In particular, it is an object of this invention to provide a photosensitive element (in particular, a pre-sensitized plate) having an oxygen-barrier, protective coating that: has increased scratch resistance relative to PVA; is flexible and does not have a tendency to crack and snow-flake over time in low-humidity conditions; and has enhanced adhesion to the photosensitive layer. Further, it is an object of this invention to provide a photosensitive element (in particular, a pre-sensitized plate) that has a protective coating which imparts on the plate: an increased photo-speed; an enhanced release of the unpolymerized portions of the photosensitive layer during development; a reduced background color; and an increased shelf-life.

Briefly, therefore, the present invention is directed to a novel a photosensitive element. The photosensitive element comprises a support having a surface; a photosensitive layer on the surface; and a transparent, protective coating on the photosensitive layer. The photosensitive layer comprises a composition of an ethylenically unsaturated compound and a photo-initiator. This composition is capable of photo-initiated addition polymerization. The protective coating is substantially impermeable to atmospheric oxygen.

In one particular embodiment of this invention, the photosensitive layer is substantially free of diazonium compounds. The protective coating comprises: (i) polyvinyl alcohol which is soluble in an aqueous solvent; and (ii) an acid.

In another embodiment, the protective coating comprises: (i) polyvinyl alcohol which is soluble in an aqueous solvent; and (ii) an organic acid.

In another embodiment, the protective coating has a pH of no greater than 5.5 and comprises: (i) polyvinyl alcohol which is soluble in an aqueous solvent; and (ii) a second polymer which is soluble in an aqueous solvent and imparts surface hardness and scratch resistance to the protective coating.

In another embodiment, the protective coating comprises: (i) polyvinyl alcohol which is soluble in an aqueous solvent; (ii) a second polymer which is soluble in an aqueous solvent and imparts surface hardness and scratch resistance to the protective coating; and (iii) an acid.

In another embodiment, the protective coating comprises: (i) polyvinyl alcohol which is soluble in an aqueous solvent; (ii) a second polymer which is soluble in an aqueous solvent and imparts surface hardness and scratch resistance to the protective coating; and (iii) a plasticizer which is soluble in an aqueous solvent.

Alternatively, this invention is directed to a novel, pre-sensitized plate for use in making a lithographic printing plate. The pre-sensitized plate comprises a support having a surface which is suitable for lithographic printing; a photosensitive layer on the surface; and a transparent, protective coating on the photosensitive layer. The photosensitive layer comprises a composition of an ethylenically unsaturated compound and a photo-initiator. This composition is capable of photo-initiated addition polymerization. The protective coating is substantially impermeable to atmospheric oxygen.

In one particular embodiment of this invention, the protective coating comprises: (i) polyvinyl alcohol which is soluble in an aqueous solvent; and (ii) an organic acid.

In another embodiment, the protective coating has a pH of no greater than 5.5 and comprises: (i) polyvinyl alcohol which is soluble in an aqueous solvent; and (ii) a second polymer which is soluble in an aqueous solvent and imparts surface hardness and scratch resistance to the protective coating.

In another embodiment, the protective coating comprises: (i) polyvinyl alcohol which is soluble in an aqueous solvent; (ii) a second polymer which is soluble in an aqueous solvent and imparts surface hardness and scratch resistance to the protective coating; and (iii) an acid.

In another embodiment, the photosensitive layer is substantially free of diazonium groups. The protective coating has a weight of from about 2 to about 10 g/m$^2$, is substantially impermeable to atmospheric oxygen, and comprises: (i) polyvinyl alcohol having a molecular weight of from about 15,000 to about 30,000 and containing from about 5 to about 15% unhydrolyzed polyvinyl acetate; (ii) polyvinyl pyrrolidone which has a molecular weight from about 20,000 to about 60,000 and is present in the protective coating in an amount such that the protective coating contains a ratio of polyvinyl pyrrolidone to polyvinyl alcohol from about 1:6 to about 1.2:1 by weight; and (iii) an acid in an amount sufficient to impart to the protective coating a pH of from about 3 to about 4.

Other objects, features, and advantages of this invention will become apparent to those skilled in the art from the following detailed description.

DETAILED DESCRIPTION OF THE INVENTION

The present invention is directed to a novel photosensitive element and, in particular, to a pre-sensitized plate for use in making a lithographic printing plate. The photosensitive element comprises a support; a photosensitive layer on the support's surface; and an oxygen-excluding, protective coating on the photosensitive layer. The photosensitive layer comprises a composition of an ethylenically unsaturated compound and a photo-initiator. This composition is capable of photo-initiated addition polymerization.

In accordance with this invention, it has been discovered that photo-speed in a photosensitive element is substantially enhanced by provision of a PVA-based protective coating that contains an acid, and especially a coating that exhibits an acidic pH, preferably less than about 5.5.

The protective coating is provided by applying an aqueous coating solution containing PVA and other aqueous-solvent-soluble components over the photopolymerizable coating on an appropriate substrate or support. The protective coating and the coating solution from which it is deposited preferably have a pH of no greater than about 5.5., more preferably from about 2 to about 4, and most preferably from about 3 to about 4.

Protective coatings of this invention have been demonstrated to exhibit increased shelf life, to provide advantageously high photo-speed, to be subject to enhanced release of unpolymerized portions of the photosensitive layer during development, and to exhibit reduced background color after development.

Also, in accordance with this invention, it has been discovered that the photo-speed of a photosensitive element comprising a photopolymerizable coating may be preserved during storage and handling by applying an overcoat comprising a PVA-based coating that includes the combination of a second soluble polymer. The second polymer is selected to impart hardness and scratch resistance, especially in low-humidity conditions. It also has been discovered that a plasticizer may be added to impart flexibility into the coating and inhibit cracking and snow-flaking that may often result from the presence of a harder, second polymer in the overcoat.

Thus, oxygen barrier properties of the PVA coating are maintained under various storage and handling conditions, so that the novel photosensitive of the element is advantageously adapted for use as a pre-sensitized plate for use in the preparation of lithographic printing plates, where processing speed is of importance for productivity and plate quality. The plate can be handled in a conventional manner without abnormal susceptibility to scratching, and can be stored and used under a variety of temperature and humidity conditions without vulnerability to cracking, snow-flaking, and the like.

A. The Support

The support may comprise various materials. For example, it may be a paper sheet, a polymer sheet, or a metal sheet.

For pre-sensitized plates for use in making lithographic printing plates, the support preferably comprises an aluminum sheet. Suitable aluminum sheets include those which are made from aluminum alloys such as Aluminum Association alloys 1050, 1100, and 3003. Sheets used for printing plate supports preferably have a thickness of from about 6 to about 20 gauge (1 gauge=0.001 inch).

Before coating an aluminum support with the photosensitive layer and protective coating, the support's surface preferably is subjected to a series of treatments which preferably includes degreasing, graining, etching, anodizing, and hydrophilizing.

To degrease an aluminum support's surface, the surface preferably is treated with a degreaser such as sodium silicate, sodium hydroxide, or various surfactants. This removes any oil adhering to the support's surface.

After degreasing, the aluminum support's surface preferably is grained to create a "roughened" surface having pits and peaks which provides a better "grip" for the photosensitive coating and also creates places for miniature ink and water reservoirs on the surface of the developed plate. Preferably, such surface roughening is produced by mechanically graining the surface, for example, by brush graining using a pumice slurry as an abrasive, wire brush graining, or ball graining. But it also may be produced by chemical or electrolytic graining techniques or by a combination of such methods.

The grained support then preferably is etched using a caustic aqueous solution containing an alkali metal hydroxide, such as potassium hydroxide, or preferably sodium hydroxide. The concentration of the alkali metal hydroxide in the caustic solution of the invention preferably is from about 1 to about 10% by weight, more preferably from about 2 to about 8% by weight, and most preferably about 3.5 to about 3.9% by weight. For optimum results, the caustic solution preferably is preheated to a temperature of from about 45° to about 80° C., more preferably from about 50° to about 60° C., and most preferably about 55° C. Under these conditions, the contact time is preferably for from about 4 to about 12 seconds, and most preferably from about 6 to about 8 seconds.

An alkaline residue and film of smut left on the surface of the aluminum support after graining and etching may readily be neutralized and removed, respectively, by application of an acidic solution, such as a 10 to 30% nitric acid solution, followed by washing with water.

A grained and aluminum etched support also may be anodically oxidized. This may be accomplished by using, for example, an acidic solution such as one containing sulfuric acid, phosphoric acid, oxalic acid, or a mixture of two or more of these or other oxidizing compounds. In a preferred procedure, the aluminum support is passed through an anodizing bath (for example, one containing from about 10 to about 40% phosphoric acid at a temperature of from about 25° to about 50° C.) resulting in the deposition of an aluminum oxide film of between about 11 and about 26 mg/dm$^2$ on the support's surface.

While an anodized aluminum support's surface already will be hydrophilic, it may be advantageous to subject the surface to treatment with silicates such as sodium or potassium silicate, to render it even more hydrophilic. Other treatments well known in the art may be used as well.

Further explanations of suitable supports are disclosed in U.S. Pat. Nos. 5,459,010; 5,219,709; 4,966,830; 4,990,428; 4,985,470; 4,594,310; and 4,537,855. These references are incorporated herein by reference.

B. The Photosensitive Layer

Once the support's surface has been pre-treated to render it hydrophilic, it is then coated with a photosensitive layer. The photosensitive layer preferably comprises an addition polymerizable ethylenically unsaturated compound and a photopolymerization initiator.

The choice of polymerizable ethylenically unsaturated compound is not particularly limited so long as it shows a chain polymerization reaction against free radicals. It preferably has at least one ethylenically unsaturated double bond, which is capable of undergoing addition polymerization and being cured by the action of the photopolymerization initiator when the photosensitive layer is irradiated with active light rays. For example, the photopolymerizable compound may be a monomer having such a double bond or a polymer having an ethylenically unsaturated double bond in its side chain or main chain. Here, "monomer" is used to differentiate the photopolymerizable compound from a so-called polymer material, and therefore includes not only a monomer in a narrow sense, but also a dimer, a trimer and an oligomer.

The polymerizable ethylenically unsaturated monomer may, for example, be an unsaturated carboxylic acid; an ester of an unsaturated carboxylic acid with a monohydroxy compound; an ester of an aliphatic polyhydroxy compound with an unsaturated carboxylic acid; an ester of an aromatic polyhydroxy compound with an unsaturated carboxylic acid; or an ester obtained by an esterification reaction of an unsaturated carboxylic acid and a polybasic carboxylic acid with a polyhydric hydroxy compound such as the above-mentioned aliphatic polyhydroxy compound or aromatic polyhydroxy compound.

Specific examples of the above-mentioned ester of an aliphatic polyhydroxy compound with an unsaturated carboxylic acid, include acrylates such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracryalate, dipentaerythritol tetracrylate, dipentaerythritol pentacrylate, dipentarythritol hexacrylate and glycerol acrylate, and the corresponding methacrylates, itaconates, crotonates, and maleates.

Specific examples of an aromatic polyhydroxy compound with an unsaturated carboxylic acid, hydroquinone diacrylate, hydroquinone dimethacrylate, resorcinol diacrylate, resorcinol dimethacrylate or pyrogallol triacrylate.

The ester obtained by the esterification reaction of an unsaturated carboxylic acid and a polybasic carboxylic acid with polyhydric hydroxy compound, may not necessarily be a single product. Typical examples include a condensation product of acrylic acid, phthalic acid and ethylene glycol, a condensation product of acrylic acid, maleic acid and diethylene glycol, a condensation product of methacrylic acid, terephthalic acid and pentaerythritol, and a condensation product of acrylic acid, adipic acid, butanediol and glycerol.

Other examples of the ethylenically unsaturated monomer useful in the present invention include a urethane acrylate such as an addition reaction product of toluene diisocyanate with hydroxyethyl acrylate; an epoxy acrylate such as an addition reaction product of a diepoxy compound with a hydroxyethyl acrylate; an acrylamide such as ethylene bisacrylamide; an allyl ester such as diallyl phthalate; and a vinyl group-containing compound such as divinyl phthalate. Among these, an acrylate or methacrylate monomer is preferable.

The polymer having an ethylenically unsaturated double bond on the main chain includes, for example, a polyester obtained by the polycondensation reaction of an unsaturated dibasic carboxylic acid with a dihydroxy compound, and a polyamide obtained by the polycondensation reaction of an unsaturated dibasic carboxylic acid with a diamine. The polymer having an ethylenically unsaturated double bond at the side chain may be a condensation polymer of a dibasic carboxylic acid having an unsaturated bond at the side chain such as itaconic acid, propylidenesuccinic acid, or ethylenemalonic acid with a dihydroxy or diamine compound. Further, a polymer having a functional group having a reactivity such as a hydroxyl group or a halogenated methyl group in the side chain, such as a polymer obtained by a polymer reaction of, for example, PVA, poly(2-hydroxyl methacrylate) or polyepichlorohydrin with an unsaturated carboxylic acid such as acrylic acid, methacrylic acid, or crotonic acid, also may be suitable for use.

The proportion of the ethylenically unsaturated compound in the photosensitive composition of the present invention is usually from about 5 to about 90% weight of the photosensitive layer, and preferably from about 10 to about 50%.

Turning to the photopolymerization initiator, any conventional initiator generally may be used. For example, benzoin, benzoin alkyl ether, benzophenone, anthraquinone, benzyl, Michler's ketone or a complex system of biimidazole and Michler's ketone, may be used. The amount of the photopolymerization initiator in the photosensitive composition usually is from about 0.1 to about 20% by weight of the photosensitive composition, and preferably from about 0.2 to about 10% by weight.

The photosensitive layer preferably further contains an organic polymer substance as a binder for the modification of the layer or for the improvement of the physical properties after the photocuring. Such a binder may be selected depending on the purpose for improvement such as compatibility, film-forming properties, developing or adhesive properties. Specifically, for example, for the improvement of the developing properties of an aqueous system, an acrylic acid copolymer, a methacrylic acid copolymer, an itaconic acid copolymer, a partially esterified maleic acid copolymer, an acidic cellulose modified product having a carboxyl group in its side chain, a polyethyleneoxide and PVP may be used. For the improvement of the coating film strength and the adhesion properties, a polyether of epichlorohydrin and bisphenol A; a soluble nylon, a polyalkylmethacrylate or polyalkylacrylate such as polymethylmethacrylate; a copolymer of an alkylmethacrylate with acrylonitrile, acrylic acid, methacrylic acid, vinyl chloride, vinylidene chloride or styrene; a copolymer of acrylonitrile with vinyl chloride or vinylidene chloride; a copolymer of a vinyl acetate with vinylidene chloride, a chlorinated polyolefin or vinylchoride; polyvinyl acetate; a copolymer of acrylonitrile with styrene; a copolymer of acrylonitrile with butadiene and styrene; a polyvinyl alkyl ether; a polyvinyl alkyl ketone; a polystyrene; a polyamide; a polyurethane; a polyethyleneterephthalathateisophalate; acetylcellulose and polyvinyl butyral may be used. Such a binder may be incorporated in an amount within a range of not more than about 500% by weight, and preferably not more than about 200%, relative to the ethylenic compound.

Other materials may be added to the photosensitive layer as required. These materials include dyes, pigments, thermal polymerization inhibitors, coating property-improving agents, plasticizers, and stabilizers.

The dye may be a coloring matter of triphenylmethane type, diphenylmethane type, oxadine type, xanthane type, iminonaphthoquinone type, azomethine type or anthracene type, represented by, for example, "Victoria Pure Blue-BOH" (manufactured by Hodogaya Chemical Company Ltd.), "Oil Blue #603" (manufactured by Olient Chemical Company Limited), "Patent Pure Blue" (manufactured by Sumitomo Mikuni Kagaku K.K.), "Crystal Violet", "Brilliant Green", "Ethyl Violet", "Methyl Green", "Erythrocine B", "Basic Fuchsine", "Malachite Green", "Oil Red", "M-cresol Purple", "Rhodamine B", "Auramine", A-p-diethylaminophenyliminonaphthoquinone, or cyano-p-diethylaminophenylace toanilide.

The thermal polymerization inhibitors may be, for example, hydroquinone, p methoxyphenol, pyrogallol, catechol, 2,6-di-t-butyl-p-cresol, or B-naphthol.

The coating property-improving agent may be an alkyl ether (such as ethyl cellulose or methyl cellulose), a carbitol (such as methylcarbitol or ethylcarbitol), a fluorine-type surfactant or a nonionic surfactant [such as "Pluronic L-64" (manufactured by Asahi Denka K.K.)].

As a plasticizer to impart flexibility and abrasion resistance to the coating film, butylphthalate, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer of acrylic acid or methacrylic acid may, for example, be used.

As the stabilizer, polyacrylic acid, tartaric acid, phosphoric acid, phosphorous acid, or an organic acid (such as acrylic acid, methacrylic acid, citric acid, oxalic acid, benzenesulfonic acid, naphthalene sulfonic acid, or 4-methoxy-2-hydroxybenzophenone-5-sulfonic acid) may, for example, be used.

As a development accelerator, a higher alcohol or an acid anhydride also may be used.

The amounts of these additives—when they are used may vary depending on the purpose of their use. Usually, they are preferably from about 0.01 to about 40% by weight, relative to the total solid content of the photosensitive layer.

Further explanations of the above-mentioned, photosensitive-layer examples—as well as examples of other suitable photosensitive layers—are disclosed in U.S. Pat. Nos. 5,459,010; 5,219,709; 4,966,830; 4,990,428; 4,985,470; 4,594,310; and 4,537,855. These references are incorporated herein by reference.

In most cases, the photosensitive layer preferably is substantially free of any diazonium compound. Presensitized plates using a photosensitive composition which is capable of photo-initiated addition polymerization typically have photo-speeds which are orders of magnitude faster than plates using a diazo-based photosensitive composition containing a photopolymerizable mixture capable of photo-initiated addition polymerization. Also, although it has been suggested that a diazo compound may be incorporated into a radiation-sensitive composition to reduce oxygen inhibition, this tends to have a considerable effect on the wear properties of the exposed composition. See U.S. Pat. No. 4,942,111 (Wade et al.). Furthermore, diazonium compounds are not compatible with many photosensitive compositions which are capable of photo-initiated addition polymerization.

To coat the photosensitive layer onto the support, the photosensitive composition of the present invention is dissolved in a solvent capable of dissolving the above-mentioned various components, and the solution is coated and dried on the surface of a support to form a photosensitive layer. The solvent useful for this purpose may, for example, be a cellosolve such as methylcellosolve acetate, ethylcellosolve or ethylcellosolve acetate, dimethylformamide, dimethylsulfoxide, dioxane, acetone, cyclohexanone, trichloroethylene, methyl ethyl ketone, methylcarbitol, methyl lactate, or propyleneglycolmonomethyletheracetate. These solvents may be used alone or in combination as a mixture of two or more of them. And the form of the photosensitive material may be suitably selected depending on the particular purpose. For example, as diluted with a proper solvent or without solvent, it may be coated and dried on a sheet such as a polymer sheet, paper sheet, or a metal sheet.

The light source for exposure useful for the photosensitive composition of the present invention is not particularly limited. Preferably, a carbon arc, a high pressure mercury lamp, a xenon lamp, a metal halide lamp, a fluorescent lamp, a tungsten lamp, a halogen lamp, a helium cadmium laser, an argon ion laser, a YAG laser, or a helium neon laser is used.

C. The Protective Coating

The components of the coating preferably should be soluble—or dispersible—in an aqueous solvent. As used herein, an "aqueous solvent" is water or a single-phase mixture containing a water-miscible, organic solvent (e.g., ethanol, acetone, ethyl ether, etc.) and at least about 60% water. If there is a significant amount of material in the protective coating which is not soluble in water, the protective coating will have reduced solubility in aqueous developing solutions, thereby making development of the plate more difficult and time-consuming. Such insoluble components also tend to generate undesirable levels of flaky, solid material in the developer reservoirs of automatic developing machines. Materials, however, that are dispersible (and technically insoluble) in aqueous solvents, usually may be used in the protective coating unless they are sticky and do not disperse well. Aqueous-dispersible materials which are sometimes used in the coating include various surfactants and wetting agents, although other components may be aqueous-dispersible as well.

The coating typically is applied to the photosensitive layer in the form of an aqueous coating solution. This includes solutions for which the solvent is water or, alternatively, a single-phase mixture of a water-miscible organic solvent and at least 60% water. The coating may be applied by any conventional method known in the art, including solvent casting, knife coating, extrusion coating, gravure coating, and reverse roll coating. The preferred viscosity and overall solid content of the coating solution depend on the coating method used.

The coating should be essentially transparent to all visible light and ultraviolet radiation. It preferably should exhibit minimal diffusion of light to minimize distortion of the image. It also preferably should exhibit minimal absorption at the wave length of the light source used for exposure. A coating exhibiting minimal absorption permits a lower-power light or radiation source to be used. Preferably, the coating should have at least 95% transmission, and more preferably 98% transmission.

The coating should be substantially impermeable to atmospheric oxygen. It preferably should have an oxygen permeability of no more than about 50 $cm^3/m^2/d/bar$ at about 20° C. when exposed to air, more preferably no greater than about 30 $cm^3/m^2/d/bar$, and most preferably no greater than about 25 $cm^3/m^2/d/bar$. When the oxygen permeability is higher, the photo-speed of the plate tends to be decreased due to oxygen inhibition.

The thickness of the coating preferably is from about 0.2 to about 15 μm, more preferably from about 1 to about 10 μm, and most preferably from about 3.7 to about 5 μm is more preferred. The coating weight preferably is from about 0.2 to about 15 $g/m^2$, more preferably from about 1 to about 10 $g/m^2$, and most preferably from about 3.7 to about 5 $g/m^2$. Reduced coating thicknesses and weights tend to have increased oxygen permeability, while increased thicknesses and weights tend to be unmanageable to apply when preparing the pre-sensitized plate and difficult to remove after exposure of the plate. They also tend to distort and absorb more light or radiation during exposure.

PVA is an essential component of the protective coating. PVA has various functions. It acts as an oxygen barrier in the protective coating, and also provides the coating with film-forming capability. The term "PVA" includes polyvinyl alcohol and its partial esters, ethers, and acetals, or copolymers thereof that contain enough unsubstituted vinyl alcohol units to maintain solubility in aqueous solvents.

Preferably, the protective coating comprises enough PVA to impart to the coating an oxygen permeability of no greater than 50 $cm^3/m^2/d/bar$ at about 20° C. when exposed to air, more preferably no greater than about 30 $cm^3/m^2/d/bar$, and most preferably no greater than about 25 $cm^3/m^2/d/bar$. This typically requires that the PVA make up from about 30 to about 97% by weight of the protective coating's content, more preferably from about 40 to about 90%, and most preferably from about 50 to about 80%. Lower PVA concentrations tend to have higher oxygen permeability which, in turn, lead to lower photo-speeds of the plate due to oxygen inhibition.

Since the protective coating typically is applied with and removed by an aqueous solution, the PVA should be soluble in an aqueous solvent. The PVA preferably should have a molecular weight of from about 5,000 to about 50,000 Daltons, more preferably, from about 15,000 to about 30,000 Daltons, and most preferably about 20,000 Daltons. If the PVA has a molecular weight above these ranges, its solution will have a high viscosity which makes applying the protective coating difficult. It also will become less soluble in aqueous solvents as its molecular weight increases. On the other hand, PVA with a lower molecular weight tends to be soft and less abrasion-resistant. In addition, PVA with lower molecular weights tend to be sticky and tend to exhibit inferior film-forming properties.

In addition to having the preferred molecular weight, the PVA preferably should contain from about 0% to about 30% unhydrolyzed polyvinyl acetate (i.e., the PVA preferably should be from about 70 to about 100% hydrolyzed), and more preferably, from about 5 to about 15% unhydrolyzed polyvinyl acetate (i.e., the PVA more preferably should be from about 85 to about 95% hydrolyzed), and most preferably, about 12% unhydrolyzed polyvinyl acetate (i.e., the PVA most preferably is 88% hydrolyzed). When the PVA contains an increased proportion of unhydrolyzed polyvinyl acetate, it tends to become insoluble in aqueous solvents.

In addition to PVA, the protective coating preferably contains an acid which is soluble in an aqueous solvent. It has been discovered in accordance with this invention that a lower pH or the presence of a proton donor yields several advantages. For example, the photo-speed of the plate tends to increase. This faster photo-speed, in turn, leads to an increased productivity in plate preparation, and reduces the potential for producing defective plates due to equipment vibration during the imaging process. In addition to faster photo-speed, the shelf-life tends to increase. Further, the unpolymerized portion of the photosensitive layer tends to exhibit better release during development. This better release, in turn, leads to reduced background color.

Either an organic acid or inorganic acid may be used. Examples of suitable mineral acids include HCl and $H_3PO_4$. If an organic acid is used, it preferably should have a pK of from about 3 to about 4. Examples of suitable organic acids include citric acid, succinic acid, tartaric acid, and maleic acid. Enough acid preferably should be added to impart a pH of no greater than about 5.5, more preferably from about 2 to about 4, and most preferably from about 3 to about 4. If organic acid is used, the ratio of acid to PVA preferably should be from about 0.3:9 to about 3:8 by weight, more preferably from about 0.5:9 to about 1:9, and most preferably about 1:10. The ratio of organic acid to total resin [i.e., PVA plus any polymer added for surface hardness and scratch resistance (see below)] preferably should be from about 0.3:9 to about 1.5:10 by weight, more preferably from about 0.5:10 to about 1.2:10, and most preferably about 1:12. The amount of organic acid in the protective coating preferably should be from about 3 to about 17% by weight, more preferably from about 5% to about 12%, and most preferably from about 5 to about 10%. Higher acid concentrations may tend to decrease the photo-speed of the plate since the protective coating's oxygen permeability tends to increase as its acid content rises. In addition, higher acid concentrations may weaken the adhesion between the protective coating and the photosensitive layer. Furthermore, a higher acid content may desensitize the plate, thereby allowing the water to invade the image areas of the plate during printing, or ink to invade the non-image areas (i.e., blinding or scumming, respectively).

The protective coating preferably contains a second polymer—a polymer in addition to PVA. This polymer preferably is soluble in an aqueous solvent and imparts surface hardness and scratch resistance to the protective coating. Suitable examples of such polymers include PVP, hydrolyzed maleic anhydride resin, polyethylene oxide, gelatin, gum Arabic, starch, Dextrin, polyacrylic acid, polymethacrylic acid, or a combination thereof. These polymers are preferably used at low humidities (i.e., at or below a relative humidity of about 65%).

Preferably the second polymer comprises an acidic polymer which both imparts scratch resistance to the protective coating and increases the photo-speed of the plate. Examples of suitable polymers include hydrolyzed maleic anhydride resin, polyacrylic acid, and methacrylic acid. Of these polymers, it is particularly preferable to use a hydrolyzed maleic anhydride resin as the second polymer. Most preferably, the polymer comprises a copolymer of hydrolyzed maleic anhydride and vinyl methyl ether, e.g., Gantrez® AN Copolymer, ISP Technologies, Inc., Wayne, N.J. At least a portion of the maleic anhydride moieties in the resin preferably should be hydrolyzed to maleic acid. More preferably, substantially all the maleic anhydride moieties should be hydrolyzed to maleic acid. Hydrolysis of the maleic anhydride moieties imparts acidity—as well as water-solubility—to the resin.

The amount of hydrolyzed maleic anhydride resin present in the protective coating preferably should be sufficient to impart on the protective coating a pH of no greater than about 5.5, more preferably from about 2 to about 4, and most preferably from about 3 to about 4. The molecular weight of the hydrolyzed maleic anhydride resin preferably should be from about 5,000 to about 60,000 Daltons; more preferably from about 10,000 to about 40,000 Daltons, and most preferably about 20,000 Daltons. Typically, if hydrolyzed maleic anhydride is used alone as the second polymer, the protective coating preferably should contain from about 10 to about 45% by weight hydrolyzed maleic anhydride resin, more preferably about 15% to about 25%, and more preferably about 20%. The ratio of hydrolyzed maleic anhydride to PVA is from about 0.5:3 to about 2:3 by weight, more preferably from about 0.5:3 to about 1:3, and most preferably about 0.75:3.

Most preferably, the second polymer comprises PVP. It has been discovered that in addition to scratch resistance, PVP contributes to the protective coating's adhesion to the photosensitive layer. It also does not have a tendency to esterify—and therefore become insoluble in aqueous solvents—with PVA and any plasticizers present in the protective coating.

The molecular weight of PVP preferably is from about 5,000 to about 90,000 Daltons, more preferably between about 20,000 and about 60,000 Daltons, and most preferably about 30,000 Daltons. PVP which has a higher molecular weight tends to be insoluble in water, and is difficult to use in the coating due to its high viscosity. PVP which has a lower molecular weight tends to be too soft and imparts less scratch resistance to the protective coating. It also tends to cause the coating to be sticky under high-humidity conditions (i.e., at relative humidities above 80%).

If PVP is used alone as the second polymer, the protective coating preferably contains from about 5 to about 50% by weight, and more preferably from about 10% to about 45%, and most preferably about 15%. The ratio of PVP to PVA in the coating preferably should be from about 1:9 to about 1.2:1 by weight, more preferably from about 1:6 and about 1.2:1, and most preferably about 1:5. The protective coating tends to lose its scratch resistance if the PVP/PVA ratio is below 1:9. On the other hand, ratios which are higher than 1.2:1 tend to cause greater oxygen permeability. They also tend to make the protective coating too brittle, which in turn leads to cracking and snow-flaking.

A plasticizer which is soluble in an aqueous solvent also may be used in the protective coating in addition to the components discussed above. The function of the plasticizer is to give the protective coating flexibility and reduce cracking and snow-flaking which tends to occur due to the surface hardening effect of the second polymer. Examples of suitable plasticizers include ethylene glycol, diethylene glycol, triethylene glycol, glycerin, sorbitol, mannitol, gluconic acid, ethylene glycol, carboxymethylcellulose, 2-pyrrolidone, partial esters of citric acid, octylphenoxy polyethoxy ethanol, etc. Preferably, the plasticizer has a molecular weight of no greater than about 400 Daltons and comprises a polyhydroxy alkyl compound, a polyhydroxy carboxylic acid, or a combination thereof. The plasticizer also preferably is a non-volatile solid at 20° C. This ensures that the plasticizer will not partially or completely evaporate from the protective coating during storage. The plasticizer additionally preferably is non-toxic and low-cost. Most preferably, the plasticizer comprises sorbitol, mannitol, gluconic acid, or a combination thereof.

Whether a plasticizer is required will depend on which and how much of the second polymer is used to impart scratch resistance on the protective coating. For example, a plasticizer generally is not needed to prevent cracking and snow-flaking where the ratio of PVP to PVA in the coating is low (e.g., about 1:5 by weight), while a plasticizer is generally needed as the ratio of PVP to PVA increases to about 1:1.

The ratio of plasticizer to PVA preferably is from about 1:8 to about 3:4, and more preferably from about 1:7 to about 1:3. The plasticizer preferably comprises from about 5% to about 30% by weight of the protective coating, more preferably from about 10 to about 20%, and most preferably from about 15 to about 20%. If the amount of plasticizer in the protective coating is too high, the coating tends to become sticky and the oxygen permeability of the coating tends to increase.

The plasticizer additionally may act as the acid component for the protective coating. Preferred examples of such plasticizers include acrylic acid and methacrylic acid, as well as dimers, trimers, oligomers, and low-molecular-weight polymers thereof. More preferably, gluconic acid is used since it is a non-volatile solid at 20° C. and is non-toxic.

A wetting agent also may be included in the aqueous coating solution. Inclusion of a wetting agent allows the aqueous coating solution to spread uniformly across the photosensitive layer's oleophilic surface and produce a smooth coating. Generally, the amount of wetting agent in the coating solution should be from about 0.01 to about 0.05% by weight of the coating solution, more preferably from about 0.02 to about 0.03%. The wetting agent preferably should have a high cloud point. This ensures that the wetting agent will not lose its solubility due to being exposed to high temperatures when drying the overcoat in an oven. The wetting agent also preferably should not tend to foam. Additionally, the wetting agents are preferably anionic and nonionic wetting agents. Cationic wetting agents are less preferred since they tend to cause scumming. Satisfactory nonionic wetting agents include octyl phenol, nonyl phenol, and acetylene based surfactants. Preferably, the wetting agent is octyl phenol having 9–10 ethylene oxide groups or nonyl phenol having 9–10 ethylene oxide groups. More preferably, the wetting agent is an acetylenic based wetting agent such as Dynol 604 (Air Products, Allentown, Pa.).

The protective coating is removed from the plate following image-wise exposure of the plate. The coating may be removed by any conventional method known in the art. The coating may be removed either with water before development or with the aqueous developer during development. However, since the developer is an alkaline solution and the protective coating is acidic, it is generally preferable to remove the coating with water before applying the developer. This ensures that the acidic coating will not neutralize the alkaline developer and slow development of the plate. It also ensures that the high-molecular-weight overcoat components will not clog the ultrafiltration devices used with some automatic developing machines. In addition, use of a separate wash station to remove the overcoat increases the speed of the production line during the processing of the plates.

D. EXAMPLES

Example 1

This experiment was conducted to determine the effect on photo-speed due to adding acid—hydrolyzed maleic anhydride resin (ISP Technologies, Inc., Wayne, N.J.)—to a protective coating. During this experiment, the following four coatings were prepared:

|  | Number | | | |
|---|---|---|---|---|
| Coating Material | 1 | 2 | 3 | 4 |
| Polyvinyl Alcohol | 10 gm | 5 gm | 6 gm | 7.5 gm |
| Polyvinyl Pyrrolidone | 0 gm | 5 gm | 0 gm | 0 gm |
| Gantrez 119 Resin | 0 gm | 0 gm | 2 gm | 2.5 gm |
| Sorbitol | 0 gm | 0 gm | 2 gm | 0 gm |
| NC-95 SURFACTANT (Liponox, LION, Tokyo, Japan) | 0.02 gm | 0.02 gm | 0.02 gm | 0.02 gm |
| WATER | 90 gm | 90 gm | 90 gm | 90 gm |

Formula 1 was made by dissolution of powdered GL-03 PVA (Gohsenol, Nipon Gohsei, Osaka, Japan) into the appropriate amount of water by heating and stirring to near boiling. Formula 2 was made by dissolving the PVA in the same manner as formula 1, and then dissolving PVP into a clear dissolved solution of PVA. Formulations 3 and 4 were made by adding the Gantrez 119 resin to the requisite amount of water and heating strongly until the maleic anhydride moiety hydrolyzed to maleic acid. Into this hot solution, powdered PVA was added and stirred until dissolved. In formula 3 the easily-water-soluble plasticizer sorbitol was added and dissolved with stirring.

DiamondPlate LA-1 argon laser plates (Western Lithotech, St. Louis, Mo.) were stripped of the factory overcoat under a red light by washing with water and patting dry with cheese cloth. Plates were cut to approximately 4"×16" pieces and overcoated with each (about 10 ml) of the four formulas with a wire-rod coater to a coat weight of 30 mg to 40 mg/4" diameter disc and dried at 55° C. for 5 minutes. Plates overcoated with each formulation were then masked with a Stouffer scale and exposed at 15 mj/cm$^2$ through a polarizing filter designed to cut light intensity down to near that of a laser exposure unit, i.e., about 50 to 250 mj/cm$^2$. Development was done by machine under standard development conditions. The following photo-speed results were obtained:

| Formula | Solid Step | Clear Step |
|---|---|---|
| 1 | 2.75 | 6.0 |
| 2 | 3.25 | 7.0 |
| 3 | 4.75 | 7.0 |
| 4 | 4.75 | 9.0 |

A formula with components corresponding to formulation #2 and formulation #3 was coated onto DiamondPlate LY-1 yttrium aluminum garnet laser plates (Western Lithotech, St. Louis) which had been prepared in the same fashion as above.

The following photo-speed results were obtained after UV exposure using the same methodology as above:

|  | Solid Step | Clear Step |
|---|---|---|
| PVA/PVP Overcoat | 2.75 | 7.0 |
| PVA/Gantrez/Sorbitol Overcoat | 4.25 | 7.0 |

In all cases, those plates overcoated with formulations containing the Gantrez polymer were 1.5 to 2 steps faster. Two steps faster is equivalent to twice the photo-speed of PVA alone or PVA/PVP alone, and represents a significant improvement.

Example 2

This experiment was conducted to determine the ability of a plasticizer (i.e., sorbitol) to prevent cracking and snow-flaking in an oxygen-barrier protective overcoat containing PVA, a second polymer—Gantrez—which imparts surface hardness and scratch resistance to the protective coating, and a surfactant.

Formulations with components corresponding to the four formulations mentioned in Example 1 were coated with a coat weight of 30 mg/4" diameter disc by wire-rod coater onto 4"×12" LA-1 plates which had the original overcoat removed as described in Example 1. While still wet, the plates were bent into a circle and stored for 3 days at 55° C. when the ambient relative humidity was less than 20%. Flood UV exposure at 15 mj/cm$^2$ of the plates through a polarizing filter followed by machine development under standard processing conditions gave the following results. Also included in this table are field results (for formulations #1 and 2) obtained with production coated plates coated with the various formulations.

|  | Cracking | Snowflakes |
|---|---|---|
| Formulation #1 | None | None |
| Formulation #2 | L,F* | L,F* |
| Formulation #3 | None | None |
| Formulation #4 | L | L |

L-Lab Observation, F = Field Observation
*Relative R.H. reported in field reports was very low An additional test was done to examine the brittleness of the materials. Approximately 10 ml of each overcoat was poured into a plastic petri dish and allowed to stand in a 55° C. oven until water had evaporated and a film formed. Attempts to remove the film with a razor blade allowed some judgments as to the brittleness of the film. The results are as follows:

Observation of the Film
Formulation #1: Could be removed, some flexibility, breaks tendency to shatter Formulation #2: Could be removed only with difficulty, had a tendency to shatter
Formulation #3: Easily removed, would not break on stressing
Formulation #4: Shattered

Example 3

This experiment was conducted to determine the effect on photo-speed of adding various acids to the oxygen-barrier, protective overcoating.

The following formulations were made using the same formulation protocols as discussed in Example 1. Organic acids with pK values in the range of 3.0 to 4.0 were added to cooled formulations and shaken into solution by hand. The resulting formulations were then bar-coated to a coat weight of 30 to 40 mg/4" diameter disc onto LA-1 plates in which the original overcoat had been removed according to protocols indicated in Example 1. Plates were dried at 55° C. for 5 minutes and then UV exposed using the same protocol as in Example 1.

|  | Formulation Number | | | |
| --- | --- | --- | --- | --- |
| Material | 6 | 7 | 8 | 9 |
| Polyvinyl Alcohol | 5 gm | 5 gm | 5 gm | 6.0 gm |
| Polyvinyl Pyrrolidone | 5 gm | 5 gm | 5 gm | 0 gm |
| Gantrez 119 Resin | 0 gm | 0 gm | 0 gm | 2.0 gm |
| Sorbitol | 0 gm | 0 gm | 0 gm | 2.0 gm |
| NC-95 SURFACTANT | 0.02 gm | 0.02 gm | 0.02 gm | 0.02 gm |
| WATER | 90 gm | 90 gm | 90 gm | 90 gm |
| Tartaric Acid | 1 gm | 0 gm | 0 gm | 0 gm |
| Succinic Acid | 0 gm | 1 gm | 0 gm | 0 gm |
| Citric Acid | 0 gm | 0 gm | 1 gm | 0 gm |

|  | Formulation Number | |
| --- | --- | --- |
| Material | 10 | 11 |
| Polyvinyl Alcohol | 5 gm | 6 gm |
| Polyvinyl Pyrrolidone | 5 gm | 0 gm |
| Gantrez 119 Resin | 0 gm | 2 gm |
| Sorbitol | 0 gm | 2 gm |
| NC-95 SURFACTANT | 0.02 gm | 0.02 gm |
| WATER | 90 gm | 90 gm |
| Tartaric Acid | 0 gm | 0 gm |
| Succinic Acid | 0 gm | 1 gm |
| Citric Acid | 0 gm | 0 gm |

The following photo-speeds were observed with these formulations after machine developments using standard protocols.

| Formulation # | Solid Step | Clear Step |
| --- | --- | --- |
| 6 | 4.25 | 7 |
| 7 | 4.75 | 8 |
| 8 | 4.75 | 8 |
| 9 | 4.75 | 8 |
| 10 | 2.75 | 6 |
| 11 | 4.25 | 7 |

Example 4

This experiment was conducted to determine the effect on photo-speed of adding various acids to the oxygen-barrier, protective overcoating.

The following formulations were made using the same formulation protocols as discussed in Example 1. Various organic and mineral acids as described below were added to cooled formulations and shaken into solution by hand. pH values of the resulting solutions are noted below. The resulting formulations were then bar-coated to a coat weight of 30 to 40 mg/4" diameter to LA-1 plates in which the original overcoat had been removed according to protocols indicated in Example 1. The plates were dried at 55° C. for 5 minutes masked with a Stouffer scale and then UV exposed through a polarizing filter used to attenuate the UV power to levels approaching that of a laser exposure unit.

|  | Formulation Number | | | |
| --- | --- | --- | --- | --- |
| Material | 1 | 2 | 3 | 4 |
| Polyvinyl Alcohol | 5 gm | 5 gm | 5 gm | 5 gm |
| Polyvinyl Pyrrolidone | 5 gm | 5 gm | 5 gm | 5 gm |
| Dynol 604 | 0.02 gm | 0.02 gm | 0.02 gm | 0.02 gm |
| WATER | 90 gm | 90 gm | 90 gm | 90 gm |
| Tartaric Acid | 1 gm | 0 gm | 0 gm | 0 gm |
| Succinic Acid | 0 gm | 1 gm | 0 gm | 0 gm |
| Citric Acid | 0 gm | 0 gm | 1 gm | 0 gm |
| Hydrochloric Acid | 0 gm | 0 gm | 0 gm | to pH of 2 |
| FORMULATION pH | 3.8 | 3.1 | 3.3 | 2.0 |

|  | Formulation Number | | | |
| --- | --- | --- | --- | --- |
| Material | 5 | 6 | 7 | 8 |
| Polyvinyl Alcohol | 5 gm | 6 gm | 5 gm | 6.0 gm |
| Polyvinyl Pyrrolidone | 5 gm | 0 gm | 5 gm | 0 gm |
| Dynol 604 | 0.02 gm | 0.02 gm | 0.02 gm | 0.02 gm |
| WATER | 90 gm | 90 gm | 90 gm | 90 gm |
| Gantrez 119 | 0 gm | 0 gm | 0 gm | 4 gm |
| Acetic Acid | 1 gm | 0 gm | 0 gm | 0 gm |
| Polyacrylic Acid | 0 gm | 0 gm | 1 gm | 0 gm |
| Gluconic Acid | 0 gm | 1 gm | 0 gm | 0 gm |
| FORMULATIONS pH | 3.5 | 3.8 | 2.8 | 2.9 |

|  | Formulation Number | | | |
| --- | --- | --- | --- | --- |
| Material | 9 | 10 | 11 | 12 |
| Polyvinyl Alcohol | 10 gm | 8 gm | 5 gm | 10 gm |
| Polyvinyl Pyrrolidone | 0 gm | 2 gm | 5 gm | 0 gm |
| Dynol 604 | 0.02 gm | 0.02 gm | 0.02 gm | 0.02 gm |
| WATER | 90 gm | 90 gm | 90 gm | 90 gm |
| Succinic Acid | 1 gm | 1 gm | 0 gm | 0 gm |
| FORMULATIONS pH | 3.1 | 3.1 | 5.5 | 6.0 |

The following photo-speeds were observed with these formulations after machine development using standard protocols.

| Formulations # | Solid Step | Clear Step |
| --- | --- | --- |
| 1 | 4.25 | 7.00 |
| 2 | 4.75 | 8.00 |
| 3 | 4.75 | 8.00 |
| 4 | 4.00 | 7.00 |
| 5 | 4.75 | 10.00 |
| 6 | 3.75 | 7.00 |
| 7 | 4.75 | 9.00 |
| 8 | 4.75 | 9.00 |
| 9 | 4.50 | 8.00 |
| 10 | 4.75 | 9.00 |
| 11 | 2.75 | 7.00 |
| 12 | 2.75 | 8.00 |

Example 5

This example shows the effect on scratch resistance due to adding PVP and hydrolyzed maleic anhydride resin (Gantrez) at relative humidities of from about 30 to about 50%.

A scratch tester was set up such that a sapphire stylus traced out an 8 inch path on the surface of a test plate a decreasing loads. Subsequently, the scratched plate was flood-exposed at 15 mj/cm$^2$ through a polarizing filter and developed. Damage was then assessed by degree of damage to the undercoat caused by oxygen inhibition at the scratch site according to the following scale:

5=No damage visible
4=Less than 1" of broken coating loss
3=Broken line across test area
2=Total removal in test area in a narrow band
1=Total removal in test area in a wide band
The results are as follows:

|  | Overcoat type and weight | | | |
|---|---|---|---|---|
| Load (g) | PVA/PVP 40 | PVA 20 | Gantrez 40 | Gantrez 20 |
| 600 | 4 | 1 | 3 | 2 |
| 500 | 4 | 1 | 4 | 2 |
| 400 | 5 | 1 | 4 | 3 |
| 300 | 5 | 1 | 5 | 3 |
| 200 | 5 | 1 | 5 | 3 |
| 180 | 5 | 1 | 5 | 3 |
| 160 | 5 | 1 | 5 | 3 |
| 140 | 5 | 1 | 5 | 5 |
| 120 | 5 | 1 | 5 | 5 |
| 100 | 5 | 1 | 5 | 5 |
| 70 | 5 | 1 | 5 | 5 |
| 50 | 5 | 2 | 5 | 5 |
| 30 | 5 | 3 | 5 | 5 |
| 10 | 5 | 5 | 5 | 5 |

The present invention is not limited to the above embodiments but can be variously modified. To illustrate, it should be noted that this invention may be used in other contexts besides with pre-sensitized plates for use in making lithographic printing plates. Indeed, this invention may be used as an effective oxygen-barrier protective overcoat on a wide variety of photosensitive elements that employ photo-initiated addition polymerization. For example, this coating may be used in preparing printed circuit boards, in other applications of microlithography and/or in photofabrication processes, and in other photomechanical uses. The above explanations in this specification only are intended to acquaint others skilled in the art with the invention, its principles, and its practical application, so that others skilled in the art may adapt and apply the invention in its numerous forms, as may be best suited to the requirements of a particular use.

What is claimed is:

1. A pre-sensitized plate for use in making a lithographic printing plate, the pre-sensitized plate comprising:
   a support having a surface suitable for lithographic printing;
   a photosensitive layer on the surface, the layer comprising a composition of an ethylenically unsaturated compound and a photo-initiator, the composition being capable of photo-initiated addition polymerization; and
   a transparent, protective coating on the photosensitive layer, the protective coating being substantially impermeable to atmospheric oxygen and comprising: (i) polyvinyl alcohol which is soluble in an aqueous solvent; and (ii) a hydrolyzed maleic anhydride resin having sufficient hydrolyzed maleic anhydride moieties to impart to the protective coating a pH of no greater than about 5.5 and being present in amount such that the protective coating contains from about 25 to about 40% by weight of the resin.

2. The pre-sensitized plate of claim 1 wherein the photosensitive layer is substantially free of diazonium compounds.

3. The pre-sensitized plate of claim 1 wherein the hydrolyzed maleic anhydride resin comprises a hydrolyzed copolymer of maleic anhydride and vinyl methyl ether.

4. A pre-sensitized plate for use in making a lithographic printing plate, the pre-sensitized plate comprising:
   a support having a surface suitable for lithographic printing;
   a photosensitive layer on the surface, the layer comprising a composition of an ethylenically unsaturated compound and a photo-initiator, the composition being capable of photo-initiated addition polymerization; and
   a transparent, protective coating on the photosensitive layer, the protective coating being substantially impermeable to atmospheric oxygen and comprising: (i) polyvinyl alcohol which is soluble in an aqueous solvent; (ii) hydrolyzed maleic anhydride resin which is present in the protective coating in an amount equal to from about 25 to about 40% by weight of the protective coating; and (iii) a plasticizer which is soluble in an aqueous solvent and is present in the protective coating in an amount equal to from about 5% to about 30% by weight of the protective coating.

5. The pre-sensitized plate of claim 4 wherein the photosensitive layer is substantially free of diazonium compounds.

6. The pre-sensitized plate of claim 4 wherein the hydrolyzed maleic anhydride resin comprises a hydrolyzed copolymer of maleic anhydride and vinyl methyl ether.

7. A pre-sensitized plate for use in making a lithographic printing plate, the pre-sensitized plate comprising:
   a support having a surface suitable for lithographic printing;
   a photosensitive layer on the surface, the layer comprising a composition of an ethylenically unsaturated compound and a photo-initiator, the composition being capable of photo-initiated addition polymerization; and
   a transparent, protective coating on the photosensitive layer, the protective coating, being substantially impermeable to atmospheric oxygen and comprising: (i) polyvinyl alcohol which is soluble in an aqueous solvent; (ii) a second polymer which is soluble in an aqueous solvent and imparts surface hardness and scratch resistance to the protective coating; and (iii) a plasticizer which is soluble in an aqueous solvent and present in the protective coating in an amount equal to about 15 to about 20% by weight of the protective coating.

8. The pre-sensitized plate of claim 7 wherein the photosensitive layer is substantially free of diazonium compounds.

9. The pre-sensitized plate of claim 7 wherein the second polymer comprises at least one material selected from the group consisting of polyvinyl pyrrolidone, a hydrolyzed maleic anhydride resin, a polyethylene oxide, gelatin, gum Arabic, a starch, dextrose, a polyacrylic acid, and a polymethacrylic acid.

10. The pre-sensitized plate of claim 7 wherein the second polymer comprises polyvinyl pyrrolidone.

11. The pre-sensitized plate of claim 7 wherein the protective coating further comprises an acid.

12. The pre-sensitized plate of claim 7 wherein the protective coating further comprises an organic acid.

13. A pre-sensitized plate for use in making a lithographic printing plate, the pre-sensitized plate, comprising:

a support having a surface suitable for lithographic printing;

a photosensitive layer on the surface, the layer comprising a composition of an ethylenically unsaturated compound and a photo-initiator, the composition being capable of photo-initiated addition polymerization; and a transparent, protective coating on the photosensitive layer, the protective coating being substantially impermeable to atmospheric oxygen and comprising: (i) polyvinyl alcohol which is soluble in an aqueous solvent; (ii) a second polymer which is soluble in an aqueous solvent and imparts surface hardness and scratch resistance to the protective coating; and (iii) a plasticizer which is soluble in an aqueous solvent, present in the protective coating in an amount equal to from about 5% to about 30% by weight of the protective coating, and a solid at 20° C.

14. The pre-sensitized plate of claim 13 wherein the plasticizer is a non-volatile solid at 20° C.

15. The pre-sensitized plate of claim 13 wherein the photosensitive layer is substantially free of diazonium compounds.

16. The pre-sensitized plate of claim 13 wherein the plasticizer is present in the protective coating in an amount equal to about 10 to about 20% by weight of the protective coating.

17. The pre-sensitized plate of claim 13 wherein the plasticizer is present in the protective coating in an amount equal to about 15 to about 20% by weight of the protective coating.

18. The pre-sensitized plate of claim 13 wherein the second polymer comprises at least one material selected from the group consisting of polyvinyl pyrrolidone, a hydrolyzed maleic anhydride resin, a polyethylene oxide, gelatin, gum Arabic, a starch, dextrose, a polyacrylic acid, and a polymethacrylic acid.

19. The pre-sensitized plate of claim 13 wherein the second polymer comprises polyvinyl pyrrolidone.

20. The pre-sensitized plate of claim 13 wherein the protective coating further comprises an acid.

21. The pre-sensitized plate of claim 13 wherein the protective coating further comprises an organic acid.

22. A pre-sensitized plate for use in making a lithographic printing plate, the pre-sensitized plate comprising:

a support having a surface suitable for lithographic printing;

a photosensitive layer on the surface, the layer comprising a composition of an ethylenically unsaturated compound and a photo-initiator, the composition being capable of photo-initiated addition polymerization; and a transparent, protective coating on the photosensitive layer, the protective coating being substantially impermeable to atmospheric oxygen and comprising: (i) polyvinyl alcohol which is soluble in an aqueous solvent; (ii) a second polymer which is soluble in an aqueous solvent and imparts surface hardness and scratch resistance to the protective coating; and (iii) a plasticizer which is soluble in an aqueous solvent, is present in the protective coating in an amount equal to from about 5% to about 30% by weight of the protective coating, and comprises at least one material selected from the group consisting of gluconic acid, mannitol, and sorbitol.

23. The pre-sensitized plate of claim 22 wherein the photosensitive layer is substantially free of diazonium compounds.

24. The pre-sensitized plate of claim 22 wherein the plasticizer is present in the protective coating in an amount equal to about 10 to about 20% by weight of the protective coating.

25. The pre-sensitized plate of claim 22 wherein the plasticizer is present in the protective coating in an amount equal to about 15 to about 20% by weight of the protective coating.

26. The pre-sensitized plate of claim 22 wherein the second polymer comprises at least one material selected from the group consisting of polyvinyl pyrrolidone, a hydrolyzed maleic anhydride resin, a polyethylene oxide, gelatin, gum Arabic, a starch, dextrose, a polyacrylic acid, and a polymethacrylic acid.

27. The pre-sensitized plate of claim 22 wherein the second polymer comprises polyvinyl pyrrolidone.

28. A pre-sensitized plate for use in making a lithographic printing plate, the pre-sensitized plate comprising:

a support having a surface suitable for lithographic printing;

a photosensitive layer on the surface, the photosensitive layer comprising a composition of an ethylenically unsaturated compound and a photo-initiator, the composition being capable of photo-initiated addition polymerization; and a transparent, protective coating on the photosensitive layer, the protective coating being substantially impermeable to atmospheric oxygen and comprising: (i) polyvinyl alcohol which is soluble in an aqueous solvent; (ii) polyvinyl pyrrolidone in a weight ratio of polyvinyl pyrrolidone to polyvinyl alcohol from about 1:9 to about 1.2:1; and (iii) an acid which comprises gluconic acid and is present in the protective coating in an amount sufficient to impart to the protective coating a pH of no greater than about 5.5.

29. The pre-sensitized plate of claim 28 wherein the photosensitive layer is substantially free of diazonium compounds.

30. A pre-sensitized plate for use in making a lithographic printing plate, the pre-sensitized plate comprising:

a support having a surface suitable for lithographic printing;

a photosensitive layer on the surface, the photosensitive layer being substantially free of diazonium compounds and comprising a composition of an ethylenically unsaturated compound and a photo-initiator, the composition being capable of photo-initiated addition polymerization; and a transparent, protective coating on the photosensitive layer, the protective coating having a weight of from about 1 to about 10 $g/m^2$, being substantially impermeable to atmospheric oxygen, and comprising: (i) polyvinyl alcohol having a molecular weight of from about 15,000 to about 30,000 and containing from about 5 to about 15% unhydrolyzed polyvinyl acetate; (ii) polyvinyl pyrrolidone which has a molecular weight from about 20,000 to about 60,000 and is present in the protective coating in a weight ratio to polyvinyl alcohol of from about 1:6 to about 1.2:1; (iii) a plasticizer which is soluble in an aqueous solvent and is present in the protective coating in an amount equal to from about 15% to about 20% by weight of the protective coating; and (iv) an acid in an amount sufficient to impart to the protective coating a pH of from about 3 to about 4.

31. A pre-sensitized plate for use in making a lithographic printing plate, the pre-sensitized plate comprising:

a support having a surface suitable for lithographic printing;

a photosensitive layer on the surface, the photosensitive layer comprising a composition of an ethylenically unsaturated compound and a photo-initiator, the composition being capable of photo-initiated addition polymerization; and a transparent, protective coating on the photosensitive layer, the protective coating being substantially impermeable to atmospheric oxygen and comprising: (i) polyvinyl alcohol which is soluble in an aqueous solvent; (ii) a second polymer which is soluble in an aqueous solvent and imparts surface hardness and scratch resistance to the protective coating; (iii) a plasticizer which is present in the protective coating in an amount equal to from about 15% to about 20% by weight of the protective coating; and (iv) an acid.

32. The pre-sensitized plate of claim 31 wherein the photosensitive layer is substantially free of diazonium compounds.

33. The pre-sensitized plate of claim 31 wherein the second polymer comprises at least one material selected from the group consisting of polyvinyl pyrrolidone, a hydrolyzed maleic anhydride resin, a polyethylene oxide, gelatin, gum Arabic, a starch, dextrose, a polyacrylic acid, and a polymethacrylic acid.

34. The pre-sensitized plate of claim 31 wherein the second polymer comprises polyvinyl pyrrolidone.

* * * * *